United States Patent
Liu et al.

(10) Patent No.: US 7,682,930 B2
(45) Date of Patent: Mar. 23, 2010

(54) METHOD OF FORMING ELEVATED PHOTOSENSOR AND RESULTING STRUCTURE

(75) Inventors: Saijin Liu, Boise, ID (US); Shu Qin, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 883 days.

(21) Appl. No.: 11/449,743

(22) Filed: Jun. 9, 2006

(65) Prior Publication Data

US 2007/0284686 A1 Dec. 13, 2007

(51) Int. Cl.
*H01L 31/09* (2006.01)
*H01L 31/18* (2006.01)
*H01L 21/00* (2006.01)

(52) U.S. Cl. .................. 438/455; 438/458; 438/57; 257/E27.127

(58) Field of Classification Search .......... 438/455, 438/458, 459, 48, 57, 97; 257/431, 432, 257/443, 444, E27.127, E27.133
See application file for complete search history.

(56) References Cited

U.S. PATENT DOCUMENTS

| | | | |
|---|---|---|---|
| 5,994,207 A | 11/1999 | Henley et al. | |
| 6,389,317 B1 | 5/2002 | Chew et al. | |
| 6,847,051 B2 | 1/2005 | Hong | |
| 2002/0000562 A1 | 1/2002 | Carlson et al. | |
| 2003/0114001 A1 | 6/2003 | Jones et al. | |
| 2003/0173522 A1 | 9/2003 | Spartiotis | |
| 2005/0074951 A1 | 4/2005 | Yoo | |
| 2005/0205904 A1 | 9/2005 | Hong | |
| 2005/0205930 A1 | 9/2005 | Williams, Jr. | |
| 2005/0269606 A1 | 12/2005 | Mouli | |
| 2006/0110844 A1 | 5/2006 | Lee et al. | |
| 2006/0273999 A1* | 12/2006 | Yamazaki et al. | 345/81 |

FOREIGN PATENT DOCUMENTS

GB 2 392 308 A 2/2004

OTHER PUBLICATIONS

Kurino, H. et al., "Intelligent Image Sensor Chip with Three Dimensional Structure", International Electron Devices Meeting, 1999. IEDM Technical Digest, Washington, DC, USA, Dec. 5-8, 1999, pp. 879-882.
Bruel, M., "Application of Hydrogen Ion beams to Silicon on Insulator Material Technology", Nuclear Instruments and Methods in Physics Research B, vol. 108, 1996, pp. 313-319.
Tong, Q. Y. et al., "Low-Temperature Hydrophobic Silicon Wafer Bonding", Applied Physics Letters, vol. 83, No. 23, Dec. 8, 2003, pp. 4767-4769.
Lu, X. et al., "Hydrogen Induced Silicon Surface Layer Cleavage", Applied Physics Letters, vol. 71, No. 13, Sep. 29, 1997, pp. 1804-1806.
Tong, Q.Y. et al., "Layer Splitting Process in Hydrogen-Implanted Si, Ge, Sic, and Diamond Substrates", Applied Physics Letters, vol. 70, No. 11, Mar. 17, 1997, pp. 1390-1392.
Kurino, H. et al., "Intelligent image sensor chip with three dimensional structure;" Electron Devices Meeting, 1999, IEDM Technical Digest, International, Washington DC, Dec. 5-8, 1999; Piscataway, NJ, USA, IEEE, Dec. 5, 1999, pp. 879-882.

* cited by examiner

*Primary Examiner*—Matthew Smith
*Assistant Examiner*—Michele Fan
(74) *Attorney, Agent, or Firm*—Dickstein Shapiro LLP

(57) ABSTRACT

Elevated crystal silicon photosensors for imagers pixels, each photosensor formed of crystal silicon above the surface of a substrate that has pixel circuitry formed thereon. The imager has a high fill factor and good imaging properties due to the crystal silicon photosensor.

13 Claims, 6 Drawing Sheets

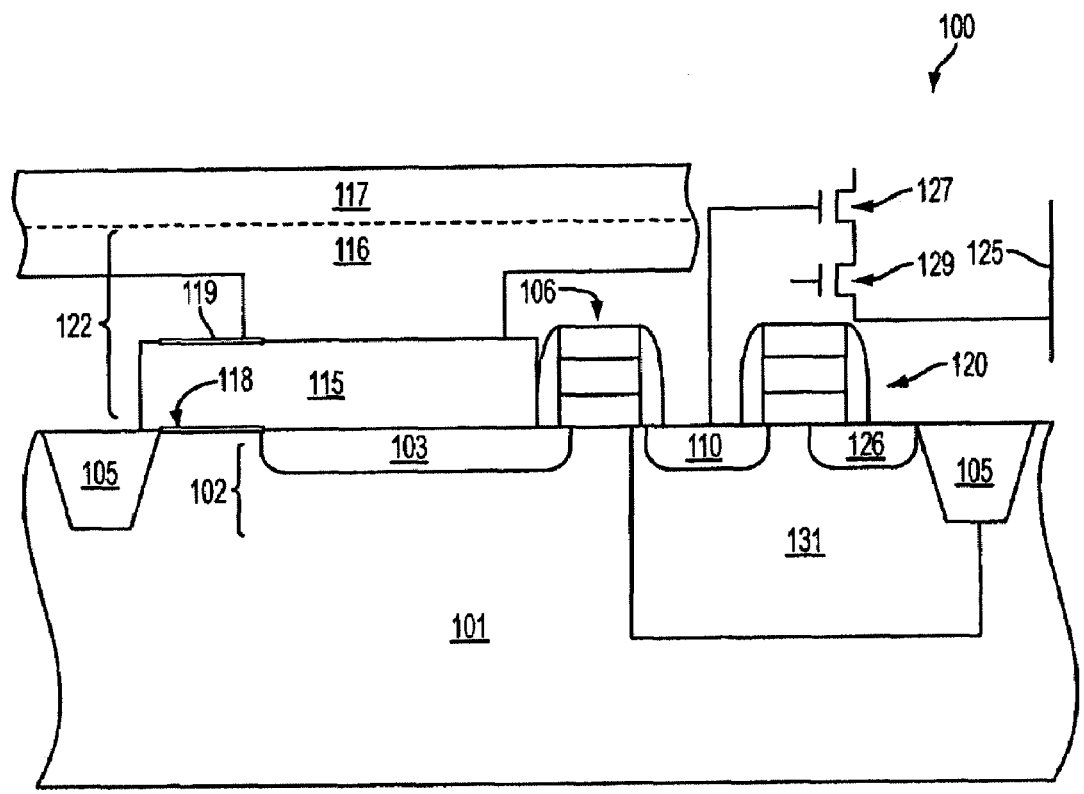
FIG. 1A – PRIOR ART
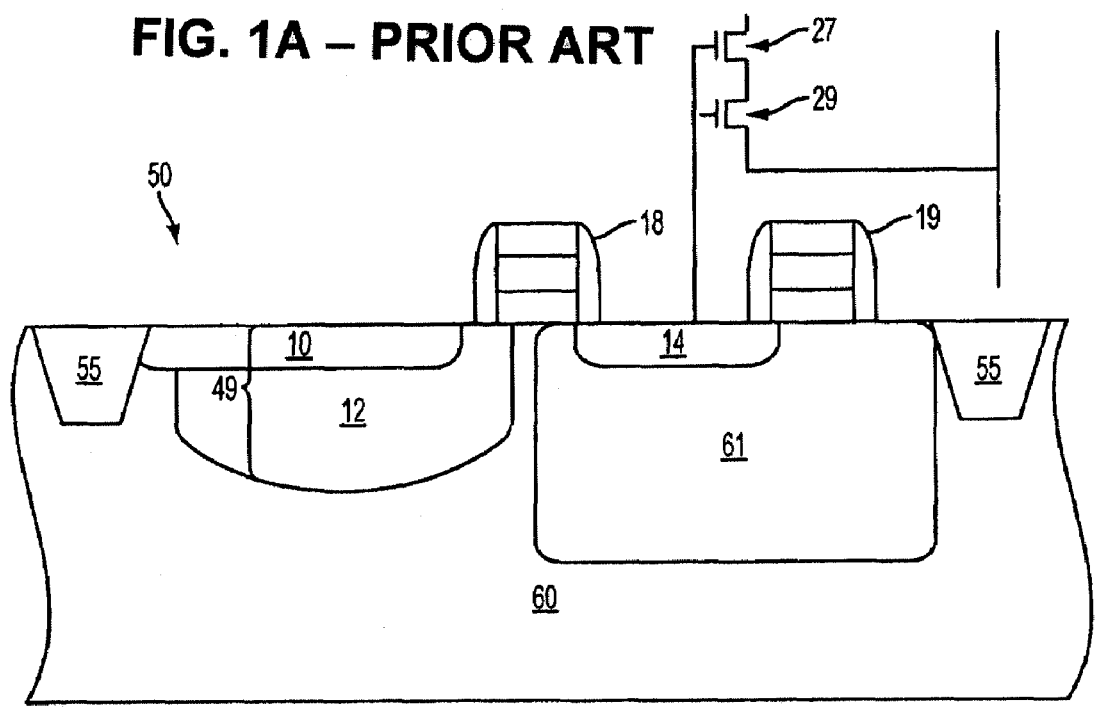
FIG.1 – PRIOR ART

US 7,682,930 B2

METHOD OF FORMING ELEVATED PHOTOSENSOR AND RESULTING STRUCTURE

FIELD OF THE INVENTION

The invention relates generally to image sensors, and more particularly, to photosensors used in image sensors and methods of fabrication thereof.

BACKGROUND OF THE INVENTION

Solid state imagers are increasingly popular due to small size, low cost, and improved image quality. One such solid state imager is a CMOS imager. CMOS sensor technology enables a higher level of integration of an image array with associated processing circuits, which can be beneficial to many digital applications such as, for example, in cameras, scanners, machine vision systems, vehicle navigation systems, video telephones, computer input devices, surveillance systems, auto focus systems, star trackers, motion detection systems, image stabilization systems and other imaging applications.

A CMOS imager circuit includes a focal plane array of pixel cells or "Pixels", each Pixel including a photosensor, for example, a photogate, photoconductor or a photodiode overlying a substrate for accumulating photo-generated charge in the underlying portion of the substrate. Each pixel has a readout circuit that includes at least an output field effect transistor formed in the substrate and a charge storage region formed on the substrate connected to the gate of an output transistor. The charge storage region may be constructed as a floating diffusion region. Each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel, as just described, perform the necessary functions of: (1) photon to charge conversion; (2) accumulation of image charge; (3) resetting the storage region to a known state; (4) selection of a pixel for readout; and (5) output and amplification of a signal representing pixel charge. The charge at the storage region is typically converted to a pixel output voltage by the capacitance of the storage region and a source follower output transistor.

CMOS imagers of the type discussed above are generally known as discussed, for example, in U.S. Pat. No. 6,140,630, U.S. Pat. No. 6,376,868, U.S. Pat. No. 6,310,366, U.S. Pat. No. 6,326,652, U.S. Pat. No. 6,204,524 and U.S. Pat. No. 6,333,205, assigned to Micron Technology, Inc., which are hereby incorporated by reference in their entirety.

FIG. 1 generally illustrates a conventional CMOS pixel structure 50. As shown, a crystal silicon photodiode 49 is formed of two doped regions 10, 12 in a substrate 60. Circuitry, including transistors gates 18, 19, 27, 29 are formed for performing the pixel functions described briefly above. An active charge storage area 14 for storing photo-charges prior to signal readout is formed in a p-well region 61 between the two transistors 18, 19. Isolation regions 55 are also formed on either side of the pixel 50 for isolating the active regions of the pixel from adjacent pixels.

As pixel sizes continue to decrease, due to desirable scaling, conventional pixel structures, such as the pixel 50 shown in FIG. 1 have various shortcomings. Specifically, a smaller photodiode has lower quantum efficiency, higher cross talk, and reduced angular response, which make it difficult to continue shrinking the pixel size while maintaining a high sensor quality.

One suggested improvement to the conventional pixel structure 50 is illustrated in FIG. 1A and is described in U.S. Patent Application Pub. No. US 2005-0269606 A1, assigned to Micron Technology, Inc., and incorporated herein by reference. As shown in FIG. 1A, an elevated photosensor 122 is formed above a surface 118 of a substrate 101 where the pixel circuitry is formed. The illustrated pixel circuitry includes transistors 106, 120, 127, and 129. The illustrated photosensor 122 comprises epitaxial layers 115, 116, 117 that are grown above the surface 118 of the substrate 101. The photosensor material of the elevated epitaxial layers 116, 117 is an amorphous silicon. The pixel 100 described in U.S. Patent Application Pub. No. US 2005-0269606 A1 has an increased fill factor over the pixel 50 illustrated in FIG. 1, as a greater portion of the top-down surface area of the pixel 100 is photosensitive.

The amorphous silicon used for the pixel in FIG. 1A, however, may not be desirable in all situations. For example, while amorphous silicon can be grown as an epitaxial layer, its inherent properties may not be as suitable for imaging purposes as those, for example, of crystal silicon. Accordingly, there is a need and desire for a pixel having a high fill factor and also having excellent photosenstive qualities. A simple and robust method of making the pixel is also desired.

BRIEF DESCRIPTION OF THE DRAWINGS

FIG. 1 shows a cross-sectional view of a portion of a CMOS pixel structure;

FIG. 1A shows a cross-sectional view of a known CMOS pixel structure having an elevated photosensor;

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, silicon-on-insulator (SOI) or silicon-on-sapphire (SOS) technology, doped and undoped semiconductors, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photosensor and associated transistors for converting photons to an electrical signal. For purposes of illustration, a single representative pixel is illustrated in some figures and described herein; however, typically fabrication of a plurality of like pixels proceeds simultaneously. Accordingly, the following detailed description is not to be taken in a limiting sense, and the scope of the present invention is defined only by the appended claims.

The present invention, in various embodiments, relates to method(s) for fabricating image sensors having elevated photosensors formed above a surface of a wafer substrate. The invention also relates to the resulting structures having elevated photosensors. In a preferred embodiment, the elevated photosensor is crystal silicon. In the following description, the invention is described in relation to a CMOS imager for convenience purposes only; the invention, however, has wider applicability to any photosensor of any imager pixel.

Figure 2:
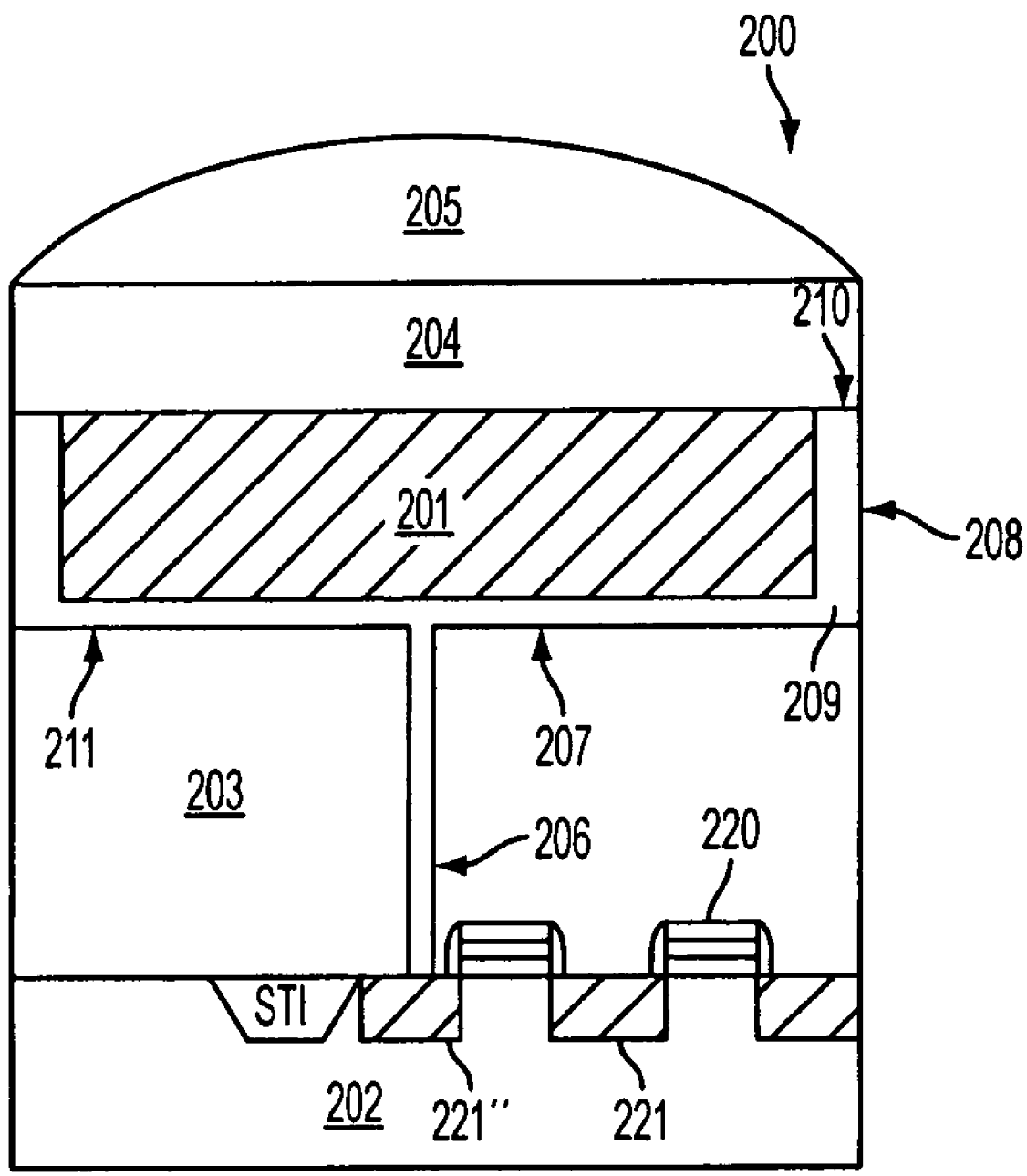
FIG. 2 shows an exemplary pixel structure in accordance with a first embodiment of the invention.

Now referring to the figures, where like numerals designate like elements, FIG. 2 shows a portion of an exemplary CMOS pixel cell 200 constructed in accordance with embodiments of the invention. The pixel cell 200 has an elevated photosensor 201 that is made of crystal silicon. Thus, exemplary pixel cell 200 has increased fill factor and photosensitive properties over the conventional pixel 50 shown in FIG. 1. In fact, the fill factor of the pixel cell 200 can be approximately 100 percent in accordance with exemplary embodiments of the present invention.

The exemplary pixel cell 200 includes a bottom substrate layer 202, which includes underlying pixel circuitry, such as transistors 220 having source drain regions 221 formed in the substrate layer 202. The transistors 220 are for performing the pixel functions such as charge transfer, amplification, reset, and read out as described above. Above the bottom substrate layer 202 is one or more dielectric layers 203 having conductive vias, or metal lines 206 running therethrough to the pixel circuitry and control circuitry. Conductive material 208 electrically connects the elevated crystal silicon photosensor 201 to metal lines 206, which in turn are connected to various active areas in the bottom substrate layer 202. For example, the metal lines 206 may connect the elevated photosensor 201 to photo-charge storage region 221' formed in the surface of the substrate 202. The elevated photosensor 201 is separated from the dielectric layer(s) 203 by a wafer bonding surface 211, as described in more detail below.

A portion of a color filter array 204 and a microlens 205 are located above the elevated photosensor 201. The portion of the color filter array 204 may be part of a Bayer pattern color filter array, having a repeating pattern of green-red-green-red filter lines interspersed with blue-green-blue-green filter lines. The microlens 205 may be part of a microlens array. The microlens 205 focuses incoming light onto the photosensor 201. As shown, each elevated photosensor 201 may be located under one color filter of an array 204 and one microlens 205. Alternatively, the color filter and microlens arrays may be formed so that each filter and microlens cover more or less than one underlying, elevated photosensor 201. Alternatively, the elevated photosensor 201 may be formed under a microlens array that functions as both a microlens array and a color filter.

Known elevated photosensors are not made of crystal silicon because formation of metal line layers necessitate a limited range of temperatures that eliminates the possibility of creating an epitaxial crystal silicon layer, which must be done at very high temperatures. The following exemplary methods, however, as described with reference to FIGS. 3A-3F, make it possible to achieve the exemplary pixel structure 200 employing an elevated crystal photodiode, as shown in FIG. 2.

Figure 3:
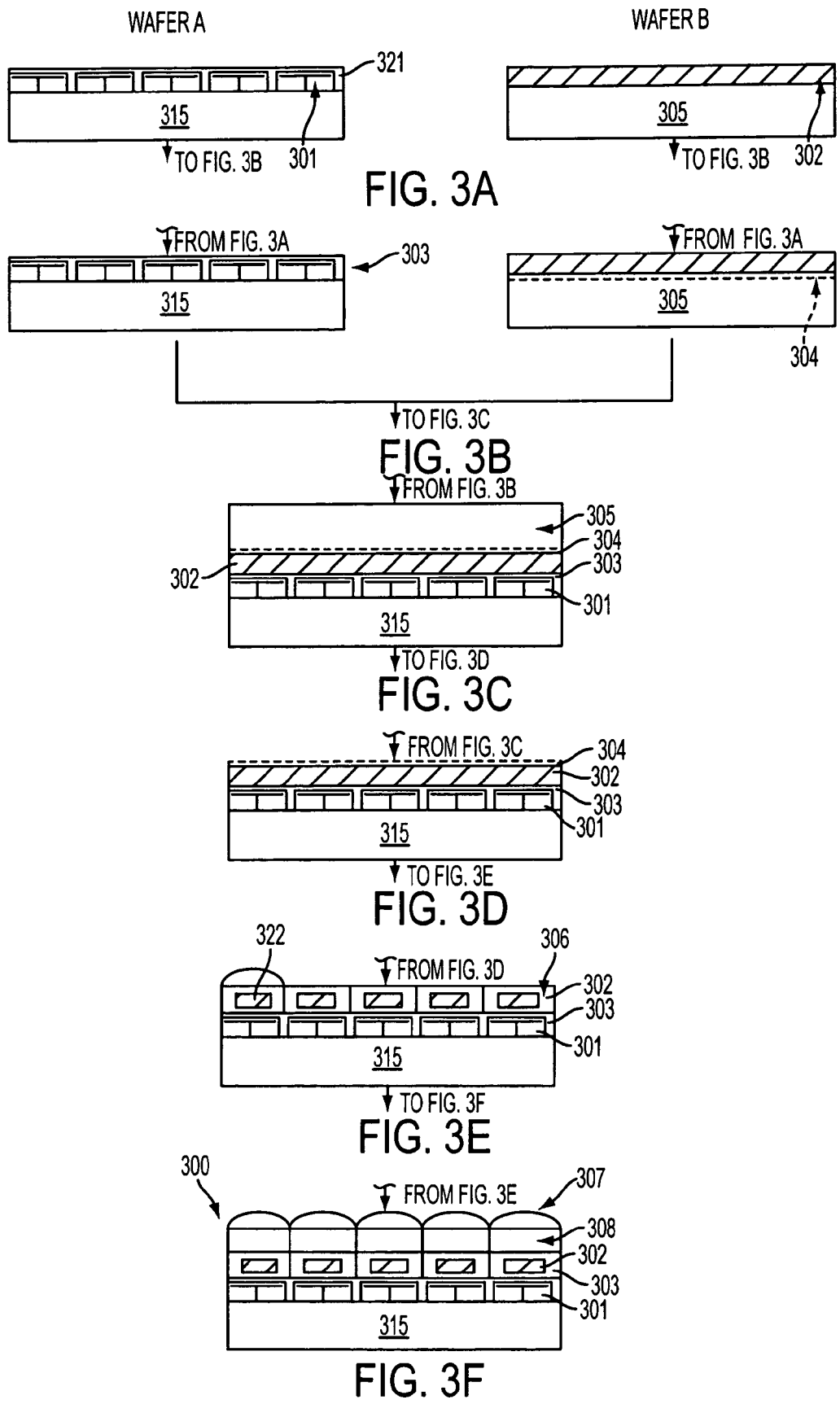
FIG. 3A shows portions of the exemplary pixel in FIG. 2 at a first stage of fabrication in accordance with an embodiment of the invention.
FIG. 3B shows portions of the exemplary pixel in FIG. 2 at a stage of fabrication subsequent to that shown in FIG. 3A.
FIG. 3C shows portions of the exemplary pixel in FIG. 2 at a stage of fabrication subsequent to that shown in FIG. 3B.
FIG. 3D shows portions of the exemplary pixel in FIG. 2 at a stage of fabrication subsequent to that shown in FIG. 3C.
FIG. 3E shows portions of the exemplary pixel in FIG. 2 at a stage of fabrication subsequent to that shown in FIG. 3D.
FIG. 3F shows portions of the exemplary pixel in FIG. 2 at a stage of fabrication subsequent to that shown in FIG. 3E.

Turning to FIG. 3A, a first step of forming a pixel cell array 300 in accordance with an exemplary embodiment of the invention is shown. On the left, a first wafer A is formed with pixel circuitry 301, which may be a series of transistor gatestacks and associated source/drawn regions a top surface of a semiconductor substrate 315. A dielectric layer 321 is formed in the areas between and over the transistor gatestacks. On the right hand side of FIG. 3A, a second wafer B having a substrate 305 is formed with a photosensitive layer 302 formed at a top surface thereof. The photosensitive layer 302 can be formed by normal implant processes and high temperature anneals.

In accordance with a preferred embodiment, the photosensitive layer 302 functions as a bulk photosensor, but alternatively, a series of individual photosensors could also be formed at a top surface of the substrate 305. The photosensitive layer 302 may be formed of crystal silicon. The photosensitive layer 302 may include several regions of doped crystal silicon, functioning, for example, as a p+/n−/p photodiode.

Turning to FIG. 3B, a second step in the exemplary method is now described. On the left, an insulation layer 303 is formed over the circuitry 301 of wafer A. The insulation layer 303 can be a silicon dioxide layer, which can be deposited at a low temperature. A polishing step can be performed at this point to improve the surface quality of the insulation layer 303. A good quality surface is beneficial for a wafer bonding step subsequently performed. On the right side of FIG. 3B, for wafer B, implant ions, which can be, for example, H+ or H2+, are implanted underneath the photosensitive layer 302 to form an ion implant region 304 in the substrate 305. The ion dosage for performing the ion implant can be in the range of about $3.5*10^{16}$ H+ ions/cm$^2$ to about $1.6*10^{17}$ H+ ions/cm$^2$. The ion implant region 304 may be formed to a sufficiently shallow depth in the substrate 305, which depends on the depth of the photodiode regions. For example, in one simulation, 500 KeV of energy was used to penetrate 6.1 microns below the surface of the substrate 305. As described above in accordance with one embodiment of the invention, the ion implant region together with the photosensitive layer 302 may function as a p+/n−/p photodiode.

As shown in FIG. 3B, in accordance with this embodiment, the circuitry 301 is formed on wafer A such that sets of circuitry 301 are formed on the wafer for individual pixels. Correspondingly, on wafer B, photosensitive regions are created in the photosensitive layer 302 to mirror the circuitry sets for individual pixels in wafer A. Thus, the two wafers are constructed with spacing that aligns the photosensitive regions in layer 302 with the associated pixel circuitry 301 to create each individual pixel, once bonded.

Next, as illustrated in FIG. 3C, wafer A and wafer B are bonded together, with wafer B being flipped over as illustrated. Initially, after wafer surface treatments such as cleaning in RCA, the two wafers A, B dipped into a hydrofluoric acid (HF) aqueous solution. Dipping the wafers in an HF solution removes native oxides that may exist on the surface. Immediately thereafter, the two wafers A, B are bonded together. This can be performed at room temperature.

Next, with reference to FIG. 3D, the wafers A, B are bonded at room temperature for an appropriate time followed by a high temperature annealing step, at a pre-selected temperature which may be in the range of about 250° C. to about 900° C., depending on the characteristics of the materials being used. The annealing can be performed in a rapid thermal annealing chamber having a nitrogen gas ambient environment. The annealing serves to enhance the bonding between wafers A and B. In one embodiment, the annealing is performed at a temperature of about 350° C.

Thereafter, an ion wafer cutting step is performed to separate the unnecessary wafer substrate portion 305 from the light ion implant region 304. Depending on the activation energy used, the ion cut operation may be done at an ambient temperature of about 400° C. The activation energy may be more important than the critical annealing temperature of the ion cutting, therefore, the ion cut process has a large processing temperature window, and can be selected as desired.

Alternatively, a controlled cleavage process may be utilized for separating the unnecessary wafer portion 305, as suggested in U.S. Pat. No. 5,994,207, incorporated herein by reference. This cleavage process may use a pressurized fluid, which can achieve a high quality cut surface at a much lower temperature than the ion cut procedure. Specifically, energetic particles, such as H+ ions are introduced to a predetermined depth in the substrate 305, as described above, to form an implant region 304 that acts as a cleavage line. Next, using a pressurized fluid or fluid jet, a cleaving action is generated to separate the implant region 304 from the remaining substrate 305. The pressurized fluid can be a liquid jet, gas stream, or some combination thereof Once separated, a post-cut polish step should also be performed, to polish and improve the surface quality for the remaining ion implant isolation region 304. As shown in FIG. 3E, the bulk photosensor layer 302 is then etched to form a plurality of individual photodiode regions 322. The photodiode regions 322 can be formed in a repeating pattern of rows and columns. Metal lines 306 are then added to connect the individual photodiode regions 322 to the underlying circuitry 301. The metal lines 306 can be formed of any conductive material, which may be reflective, to improve the quantum efficiency of the structure. In one embodiment, the metal lines 306 are made of aluminum.

As shown in FIG. 3F, additional processing steps are then performed to complete the pixel array 300. This includes formation of a color filter array 308 and an overlying microlens array 307. These arrays can be formed by any method known in the art. In one embodiment, one color filter of the color filter array 308 and one microlens of the microlens array 307 is formed above each one photodiode region 322. In another embodiment, the color filters or microlenses may be shared by more than one photodiode region 322.

Figure 4:
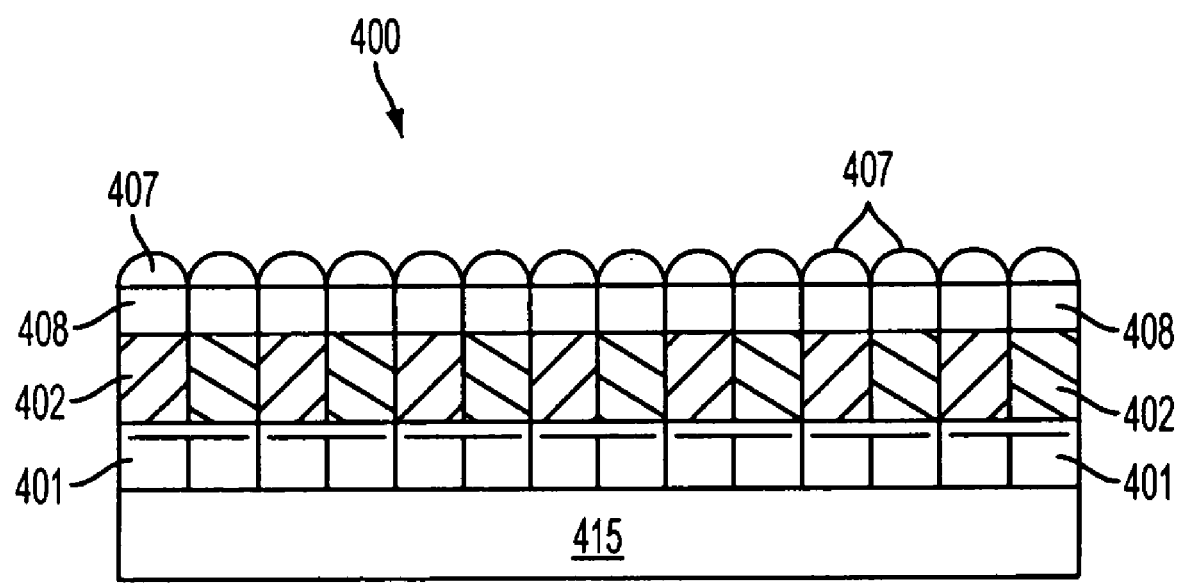
FIG. 4 shows an exemplary pixel structure constructed in accordance with a second embodiment of the invention.

A portion of a second exemplary pixel array 400 is shown in FIG. 4, in accordance with a second embodiment of the invention. The pixel array 400 is constructed using the exemplary methods described above in connection with FIGS. 3A-3F, except for the matching of photosensitive regions. Specifically, as shown in FIG. 4, the individual crystal silicon photosensitive regions 402 do not correspond to the underlying pixel circuitry 401 in a 1:1 correspondence as in pixel array 300. Rather, the illustrated array 400 has photosensitive regions 402 that share underlying pixel circuitry 401 formed on a substrate 415. The illustrated pixel array 400 also has a microlens array 407 and color filter array 408. For purposes of simplification, other portions of the pixel array 400, such as metallization and dielectric layers, are not shown.

This shared circuitry pixel array 400 layout can operate as described in U.S. patent application Ser. No. 11/126,275, assigned to Micron Technology, Inc., and incorporated herein by reference in its entirety. It should be understood that although the pixel array 400 is shown having two photosensitive regions 402 sharing each set of underlying pixel circuitry 401, other configurations having other ratios between the photosensitive regions 402 and circuitry 401 are also within the scope of the invention. In fact, the invention is not limited to any specific rations among photosensitive regions 402, underlying circuitry 401, and microlens407/color filters 408.

Figure 5:
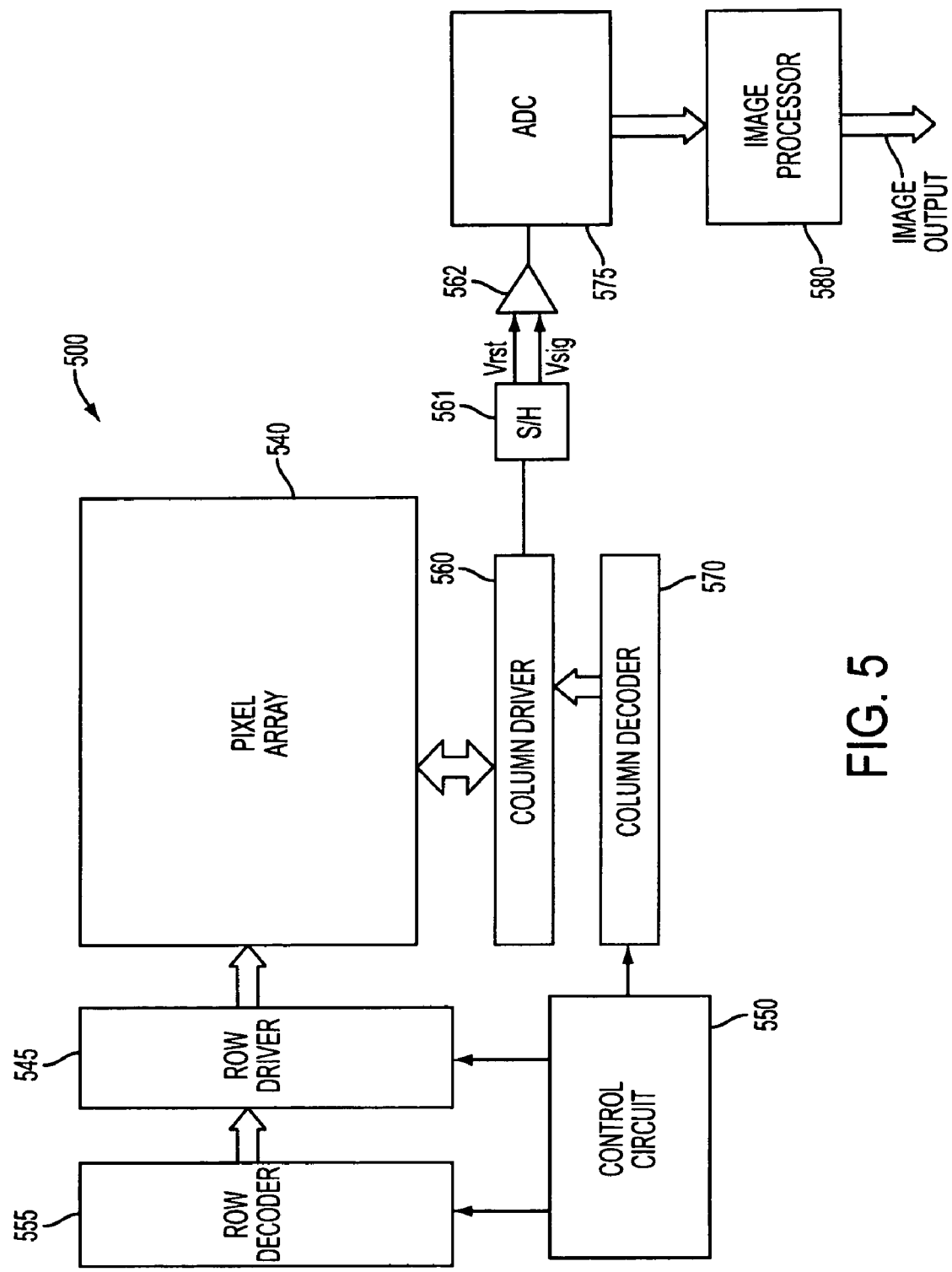
FIG. 5 is a block diagram of an imager that includes the exemplary pixel shown in FIG. 2.

FIG. 5 illustrates an exemplary imaging device 500, having a pixel array 540 which may include the exemplary pixel structure 200 or other pixels formed in accordance with one of the exemplary embodiments described above. Row lines of the array 540 are selectively activated by a row driver 545 in response to row address decoder 555. A column driver 560 and column address decoder 570 are also included in the imaging device 500. The imaging device 500 is operated by the timing and control circuit 550, which controls the address decoders 555, 570. The control circuit 550 also controls the row and column driver circuitry 545, 560.

A sample and hold circuit 561 associated with the column driver 560 reads a pixel reset signal Vrst and a pixel image signal Vsig for selected pixels of the array 540. A differential signal (Vrst-Vsig) is produced by differential amplifier 562 for each pixel and is digitized by analog-to-digital converter 575 (ADC). The analog-to-digital converter 575 supplies the digitized pixel signals to an image processor 580 which forms and may output a digital image. The component parts shown in FIG. 5, including the image processor 580, can be built on a single semiconductor chip or on more than one chip. A light source may also be on the chip or external thereto. Circuitry for wireless transmission/receipt of information can also be on a chip with the imaging device 500. This circuitry can be used for wirelessly transmitting data, including representations of output pixel signals, from pixels in the imaging device 500 to external processing systems or related circuitry.

Figure 6:
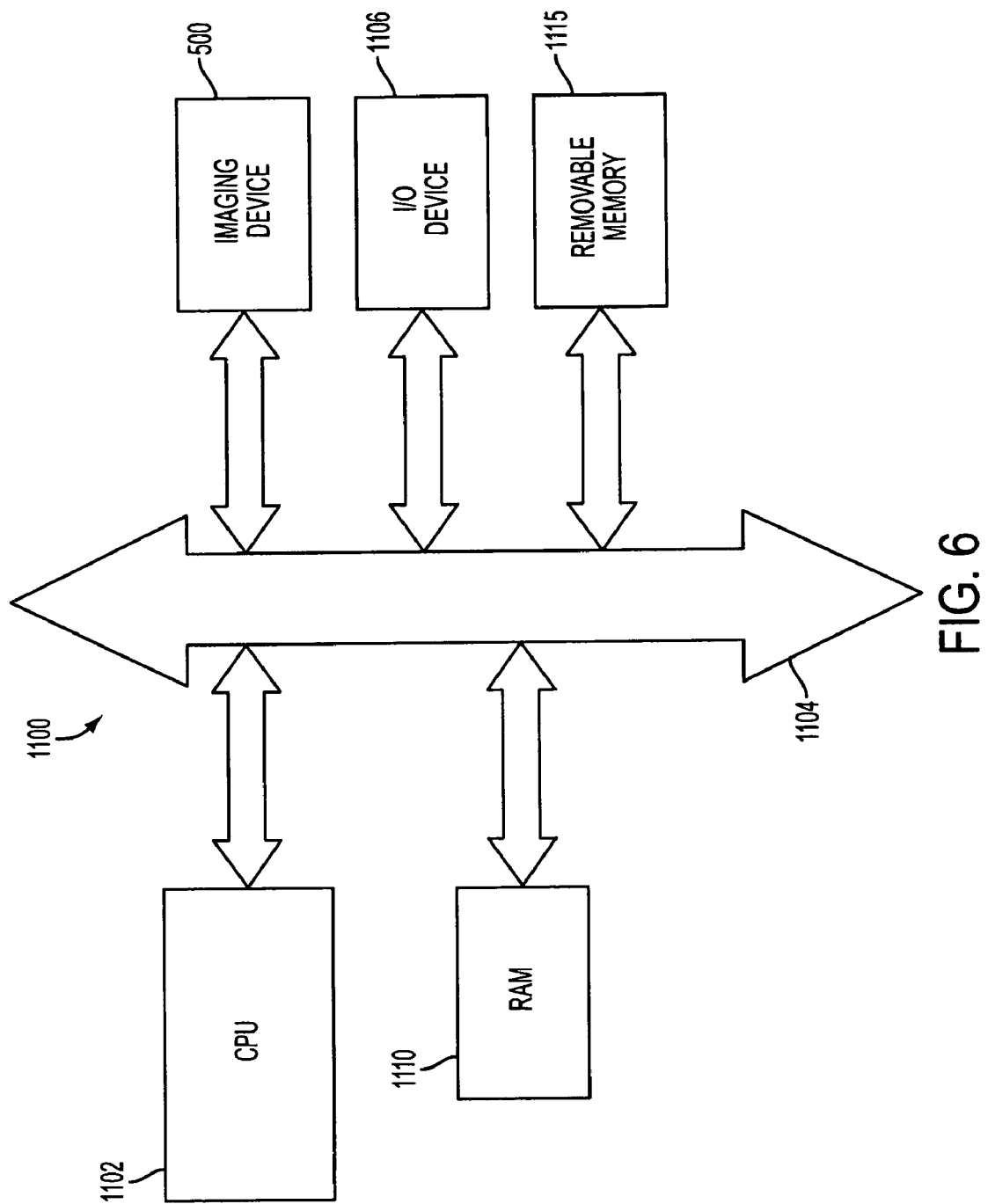
FIG. 6 is a block diagram of a processing system that includes the imager shown in FIG. 5.

FIG. 6 shows system 1100, a typical processor system modified to include the imaging device 500 (FIG. 5) of the invention. The system 1100 is exemplary of a system having digital circuits that could include image sensor devices. Without being limiting, such a system could be a camera system.

System 1100, for example, a camera system, generally comprises a central processing unit (CPU) 1102, such as a microprocessor, that communicates with an input/output (I/O) device 1106 over a bus 1104. Imaging device 500 also communicates with the CPU 1102 over the bus 1104. The system 1100 also includes random access memory (RAM) 1110, and can include removable memory 1115, such as flash memory, which also communicate with the CPU 1102 over the bus 1104. The imaging device 500 may be combined with a processor, such as a CPU, digital signal processor, or microprocessor, with or without memory storage on a single integrated circuit or on a different chip than the processor. The processor system 110 may also be used for other purposes, such as in connection with a motion detection system.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. For example, although the embodiments are described with reference to a CMOS imager, the invention is not limited to a particular type of imager, but rather, could be used with any solid state image sensors. In addition, any modification, though presently unforeseeable, of the present invention that comes within the spirit and scope of the following claims should be considered part of the present invention.

What is claimed as new and desired to be protected by Letters Patent of the United States is:

1. A method of forming a pixel comprising:
   forming a photosensor in a first wafer;
   forming pixel circuitry on a second wafer;
   bonding said first wafer to said second wafer; and
   subsequent to the bonding act, connecting said photosensor to said pixel circuitry by forming a conductive line in contact with a doped region of the first wafer and in contact with the photosensor.

2. The method of claim 1, wherein said photosensor comprises crystal silicon.

3. The method of claim 2, further comprising the act of ion cutting to remove at least a portion of said first wafer after said first and second wafers are bonded.

4. The method of claim 2, further comprising the act of implanting ions into said first wafer.

5. The method of claim 4, wherein the ions are implanted in a region beneath the photosensor.

6. The method of claim 5, further comprising the act of ion cutting to remove a portion of the first wafer wherein the ions are not implanted.

7. The method of claim 5, further comprising the act of utilizing a pressurized fluid to perform a controlled cleavage of at least a portion of the first wafer.

8. The method of claim 2, wherein the step of bonding comprises a direct bonding of the first and second wafer surfaces utilizing a high bonding energy.

9. The method of claim 2, wherein the act of bonding comprises annealing the first and second wafers at a predetermined temperature for a predetermined time.

10. The method of claim 9, wherein the predetermined temperature is within the range of about 350° C. to about 450° C.

11. The method of claim 2, wherein the act of forming a photosensor comprises forming and doping a region of crystal silicon.

12. The method of claim 1, further comprising the act of forming a plurality of photosensors and a plurality of pixel circuitry spaced respectively on the first and second wafers to align with one another to form a plurality of pixels when bonded together.

13. A method of forming a pixel array comprising:
   forming a photosensitive crystal silicon material over a first wafer;
   implanting hydrogen ions underneath the photosensitive crystal silicon material in said first wafer;
   forming pixel circuitry including transistors on a second wafer;
   forming an insulation material over the pixel circuitry;
   polishing a top surface of the insulation material;
   treating a top surface of each of the first and second wafers;
   bonding the first and second wafers to form one structure;
   removing at least a portion of the first wafer from the one structure;
   forming individual photosensors from said photosensitive crystal silicon material; and
   subsequent to the bonding act, connecting each photosensor to said pixel circuit by forming a conductive line in contact with a doped region of the first wafer and in contact with the photosensor.

* * * * *